(12) United States Patent
Nakata et al.

(10) Patent No.: US 7,928,491 B2
(45) Date of Patent: Apr. 19, 2011

(54) SEMICONDUCTOR MEMORY DEVICE HAVING REFERENCE TRANSISTOR AND METHOD OF MANUFACTURING THE SAME

(75) Inventors: Masashi Nakata, Kanagawa (JP); Fumihiko Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 11/504,689

(22) Filed: Aug. 16, 2006

(65) Prior Publication Data

US 2007/0228444 A1    Oct. 4, 2007

(30) Foreign Application Priority Data

Mar. 30, 2006    (JP) ................... 2006-095285

(51) Int. Cl.
*H01L 29/76* (2006.01)
(52) U.S. Cl. . 257/314; 257/316; 257/319; 257/E29.129; 257/E29.306
(58) Field of Classification Search ........... 257/E29.129, 257/314, E29.306, 316, 319
See application file for complete search history.

(56) References Cited

U.S. PATENT DOCUMENTS

| | | | | |
|---|---|---|---|---|
| 5,859,798 A * | 1/1999 | Yero | .................. | 365/185.25 |
| 6,094,374 A * | 7/2000 | Sudo | .................. | 365/185.22 |
| 6,285,589 B1 * | 9/2001 | Kajitani | .............. | 365/185.2 |
| 6,348,378 B1 * | 2/2002 | Lee | ................... | 438/257 |
| 6,649,471 B2 * | 11/2003 | Cho et al. | .......... | 438/257 |
| 6,807,097 B2 * | 10/2004 | Takano et al. | .......... | 365/185.03 |
| 2001/0003507 A1 * | 6/2001 | Maruyama et al. | ...... | 365/185.2 |
| 2001/0014035 A1 * | 8/2001 | Briner | ................ | 365/185.03 |
| 2002/0039322 A1 * | 4/2002 | Tran et al. | ............ | 365/230.06 |
| 2003/0022442 A1 * | 1/2003 | Cho et al. | .......... | 438/257 |
| 2004/0248367 A1 * | 12/2004 | Shyu et al. | ......... | 438/257 |
| 2005/0112821 A1 * | 5/2005 | Kim et al. | .......... | 438/258 |
| 2005/0285207 A1 * | 12/2005 | Kim | ................... | 257/377 |

FOREIGN PATENT DOCUMENTS

JP    9-092734    4/1997

OTHER PUBLICATIONS

Brown et al., Nonvolatile Semiconductor Memory Technology, IEEE Press, 1998, p. 118-119.*
F. Masuoka, Flash Memory Technology Handbook, Aug. 15, 1993, pp. 34-36 (includes partial English translation of cited document).

* cited by examiner

*Primary Examiner* — Eugene Lee
*Assistant Examiner* — Peniel M Gumedzoe
(74) *Attorney, Agent, or Firm* — Foley & Lardner LLP

(57) ABSTRACT

A semiconductor memory device has: a substrate; a memory cell transistor of a split-gate type formed on the substrate; and a reference transistor formed on the substrate and used for generating a reference current that is used in sensing data stored in the memory cell transistor. The memory cell transistor has a floating gate and a control gate, while the reference transistor is a MIS (Metal Insulator Semiconductor) transistor having a single gate electrode.

11 Claims, 24 Drawing Sheets

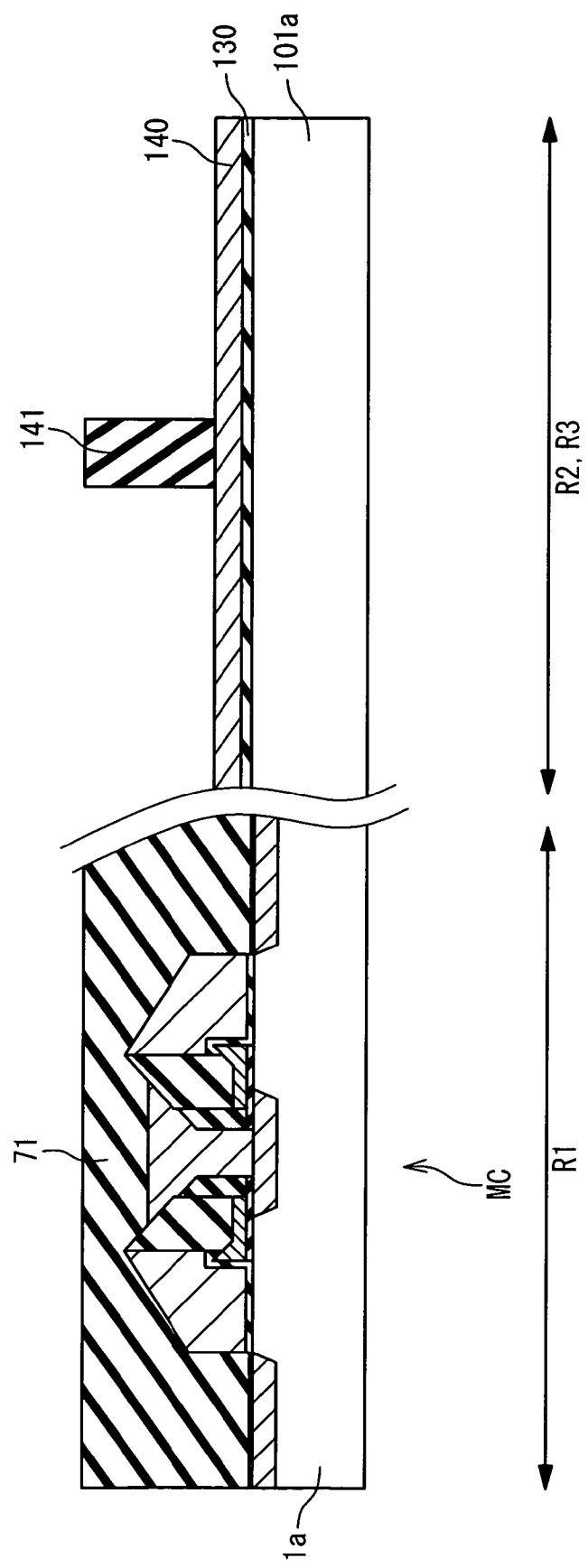

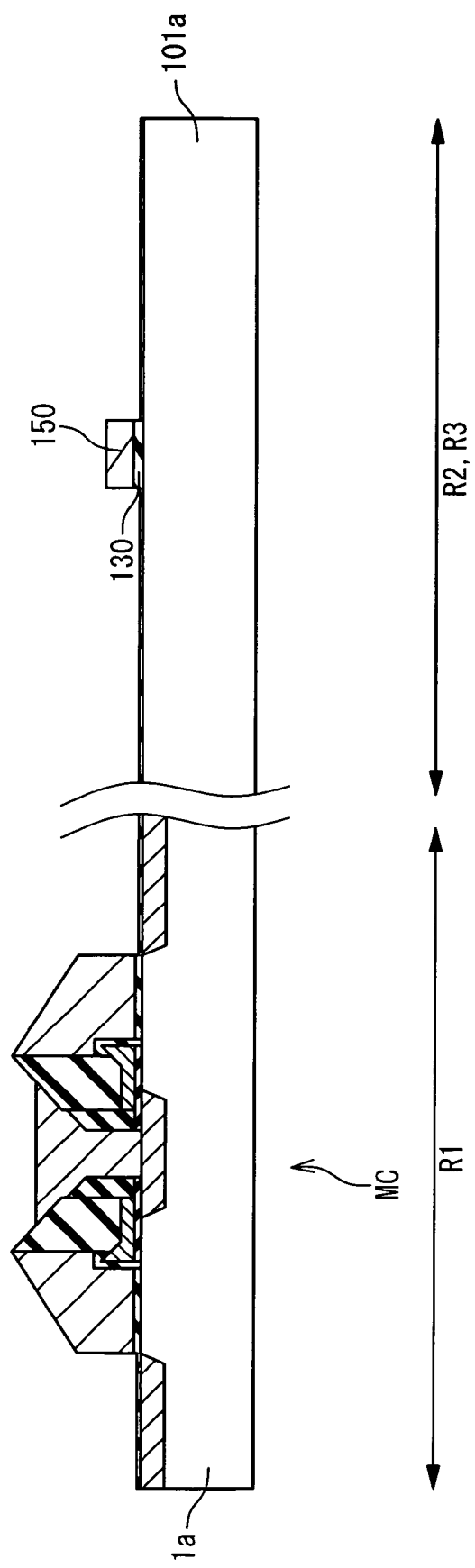

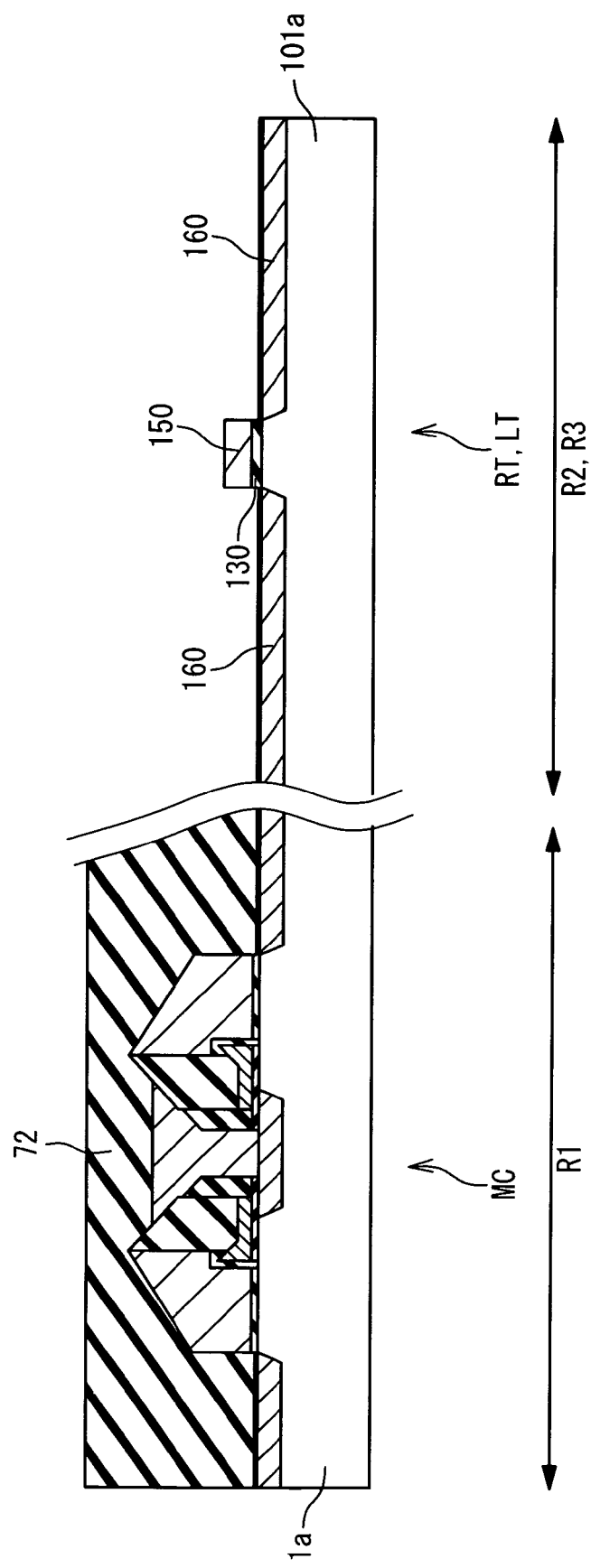

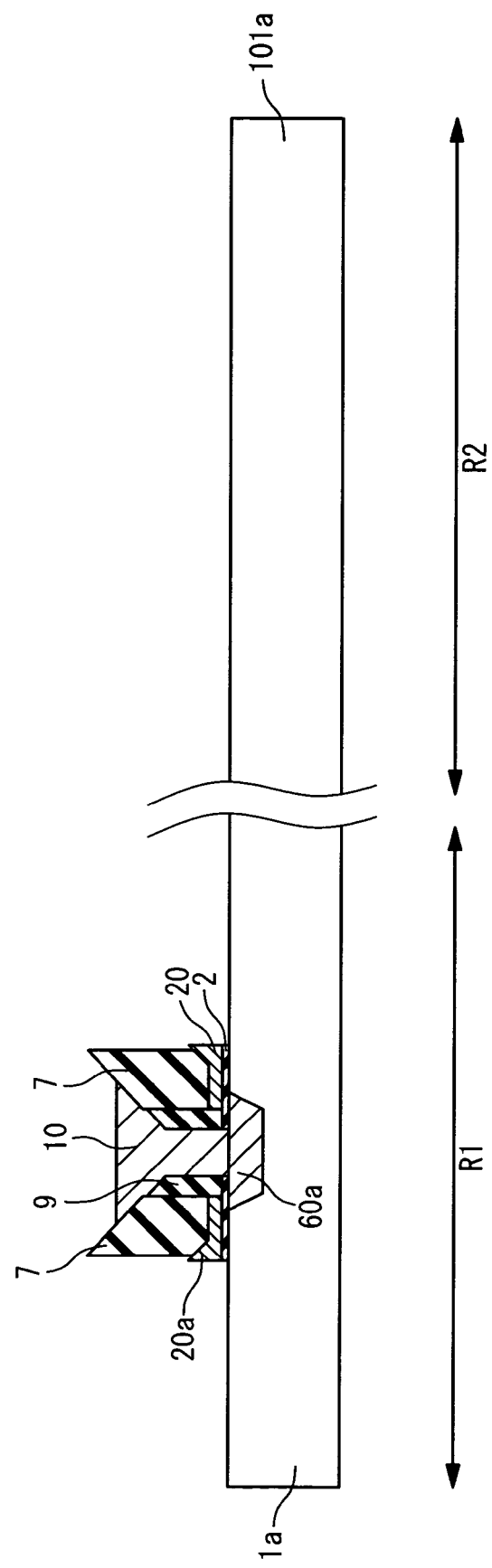

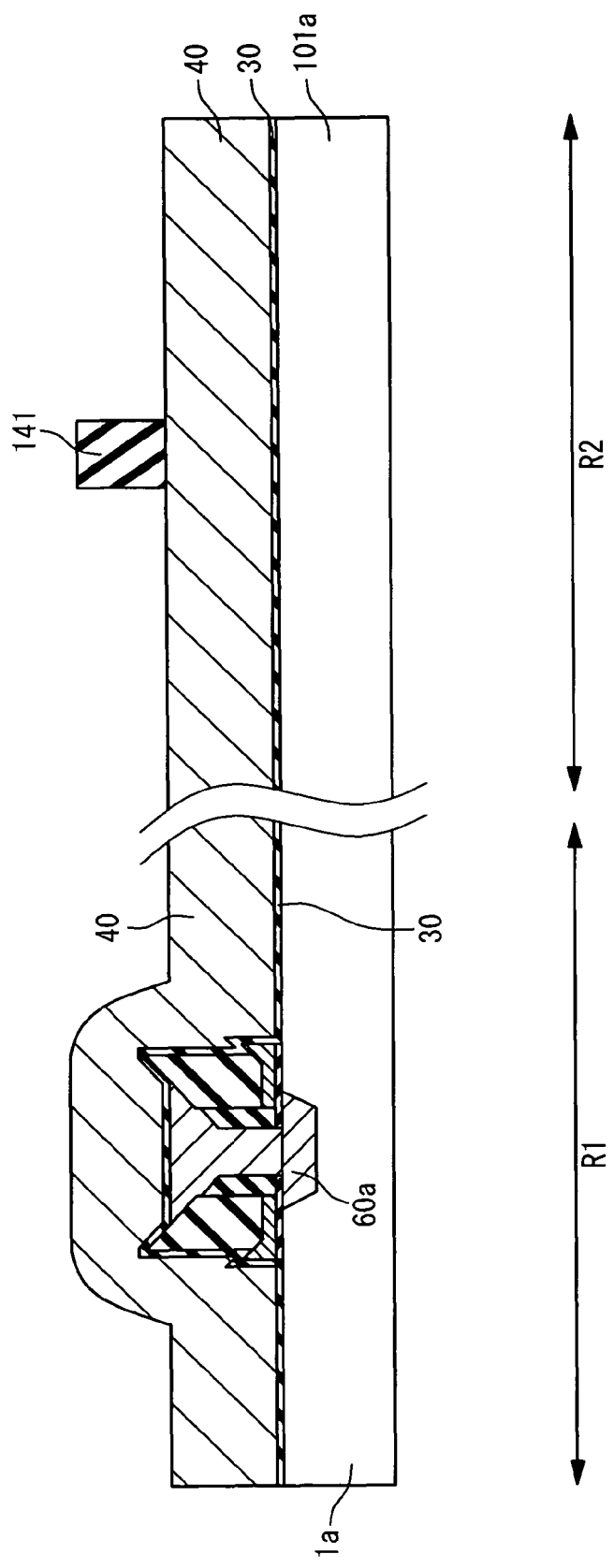

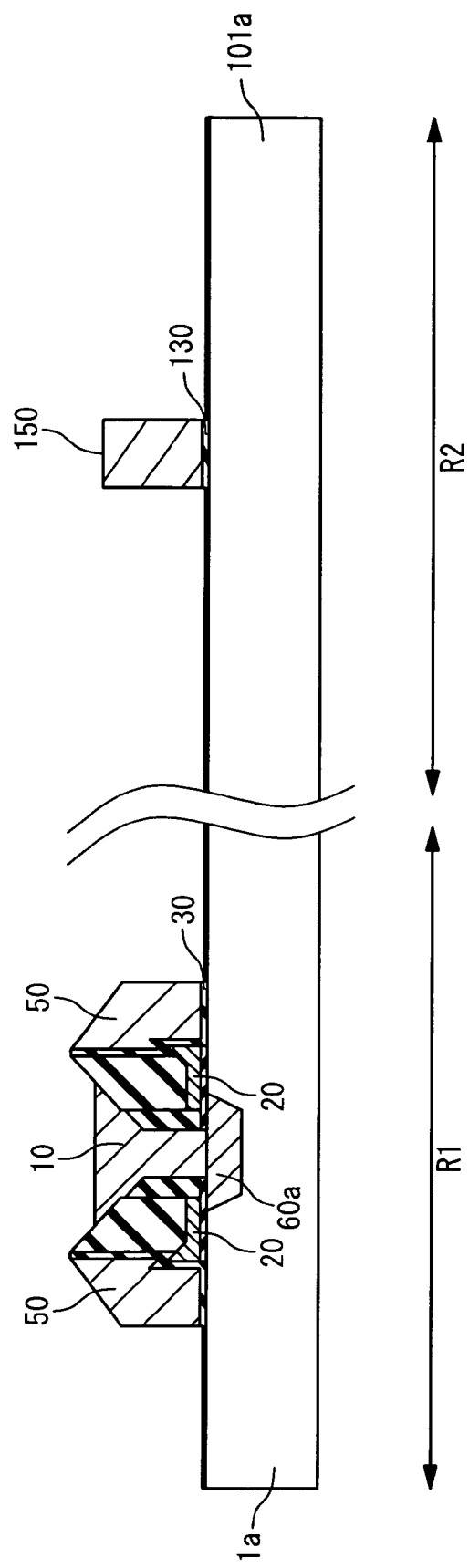

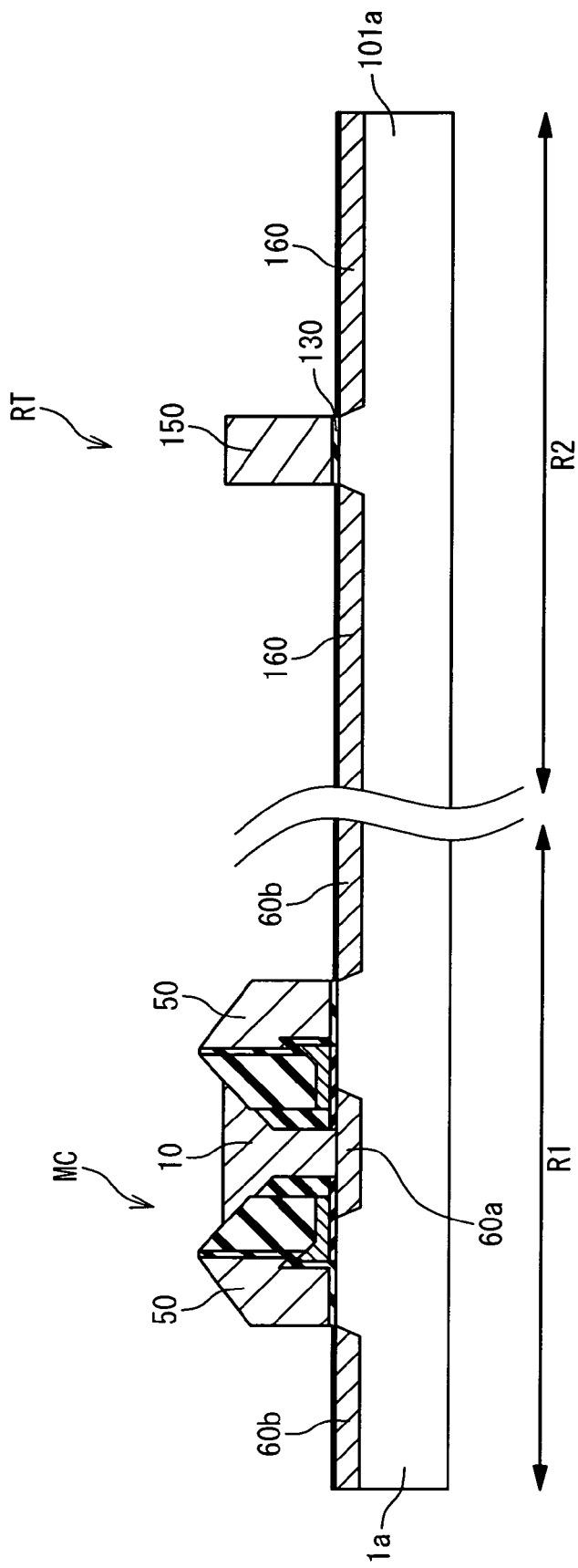

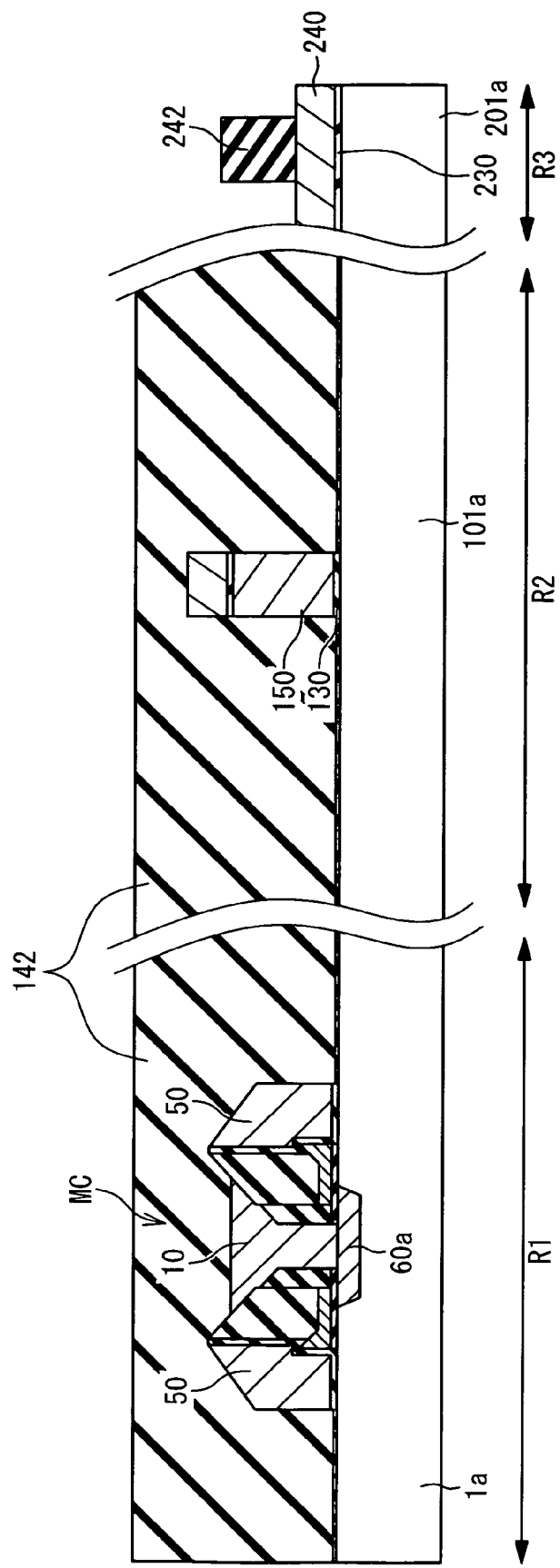

SEMICONDUCTOR MEMORY DEVICE HAVING REFERENCE TRANSISTOR AND METHOD OF MANUFACTURING THE SAME

BACKGROUND OF THE INVENTION

1. Field of the Invention

The present invention relates to a semiconductor memory device and a method of manufacturing the same. In particular, the present invention relates to an electrically programmable/erasable nonvolatile semiconductor memory device and a method of manufacturing the same.

2. Description of the Related Art

As one kind of an electrically programmable/erasable nonvolatile semiconductor memory device, a split-gate nonvolatile memory is publicly known (see, for example, Japanese Laid Open Patent Application JP-A-Heisei 9-92734). In the split-gate nonvolatile memory, only a part of a control gate overlaps with a floating gate. Moreover, not only the floating gate but also a part of the control gate is provided over a channel region, and hence not only the floating gate but also the part of the control gate is used for switching. For this reason, the split-gate nonvolatile memory has an advantage that an over-erasing is prevented.

A threshold voltage of a nonvolatile memory cell transistor varies depending on charge amount held in the floating gate. In a case of an N-channel memory cell transistor, for example, electrons are injected into the floating gate in a program operation, and thus the threshold voltage is increased. On the other hand, electrons are drawn out of the floating gate in an erase operation, and thus the threshold voltage is decreased. At the time of a read operation, a read current does not flow through a programmed cell but through an erased cell. It is therefore possible to sense data stored in the memory cell transistor by comparing the amount of the read current with a predetermined reference current Iref. As a reference transistor for generating the reference current Iref, a transistor having the same structure as the memory cell transistor has been conventionally used (see, for example, "Fujio Masuoka, Flash Memory Technology Handbook, Aug. 15, 1993, pp. 34-36). The reference transistor is fixed to an erased state.

SUMMARY OF THE INVENTION

The present invention has recognized the following points. According to the conventional technique, the reference transistor is fixed to the erased state. However, there is a possibility that electrons are injected into or drawn out of the floating gate due to defects in an insulating film, voltage peripherally applied, and so forth. That is to say, there is a possibility that a threshold voltage of the reference transistor varies. This causes variation (fluctuation) of the reference current Iref that should be kept constant.

In a first aspect of the present invention, a semiconductor memory device of a split-gate type is provided. The semiconductor memory device has a substrate, a memory cell transistor of a split-gate type formed on the substrate, and a reference transistor formed on the substrate. The reference transistor is used for generating a reference current that is used in sensing data stored in the memory cell transistor. The memory cell transistor has a floating gate and a control gate. On the other hand, the reference transistor is a MIS (Metal Insulator Semiconductor) transistor having a single gate electrode. In the device thus constructed, a transistor having the same structure as the memory cell transistor is not used as the reference transistor.

The reference transistor according to the present invention is a mere MIS transistor that does not have a floating-gate-structure, and has only the single gate electrode as the gate structure. Therefore, the time variation of the threshold voltage of the reference transistor due to incomings and outgoings of electrons to the floating-gate-structure can be prevented. As a result, the reference current used for sensing data is stabilized. Thus, characteristics and reliability of the semiconductor memory device are improved.

In a second aspect of the present invention, a method of manufacturing a semiconductor memory device is provided. The method includes the processes of: (A) forming a memory cell transistor of a split-gate type on a substrate; and (B) forming a reference transistor on the substrate. The reference transistor is used for generating a reference current that is used in sensing a data stored in the memory cell transistor. The (B) process includes the processes of: (B1) forming a gate insulating film on the substrate; (B2) depositing a polysilicon film on the gate insulating film; (B3) etching the polysilicon film by using a mask having a pattern, to form a single gate electrode; and (B4) forming a diffusion layer in the substrate through an ion implantation with using the single gate electrode as a mask.

According to the semiconductor memory device of the present invention, time variation of the reference current used for sensing data can be prevented. Consequently, characteristics and reliability of the semiconductor memory device are improved.

BRIEF DESCRIPTION OF THE DRAWINGS

The above and other objects, advantages and features of the present invention will be more apparent from the following description taken in conjunction with the accompanying drawings, in which:

FIGS. 7A to 7C are cross sectional views showing a manufacturing process of a reference transistor according to a first embodiment;

FIGS. 8A to 8D are cross sectional views showing a manufacturing process of a reference transistor according to a second embodiment;

FIGS. 10A to 10E are cross sectional views showing a manufacturing process of a reference transistor according to the third embodiment.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the present embodiments illustrated for explanatory purposed.

1. Structure

Figure 1:
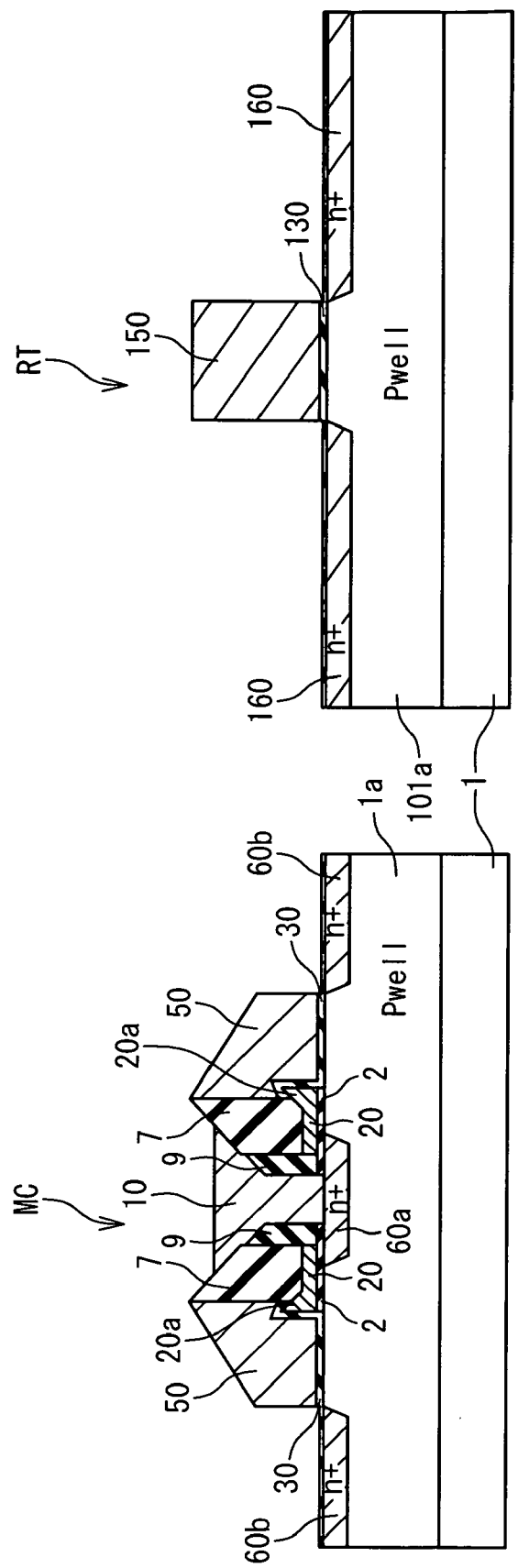
FIG. 1 is a cross sectional view showing a structure of a nonvolatile memory according to an embodiment of the present invention.

FIG. 1 is a sectional view showing a structure of a nonvolatile memory according to the present embodiment. Shown in FIG. 1 are a memory cell transistor MC used as a nonvolatile memory cell and a reference transistor RT. The reference transistor RT is a transistor for generating a reference current Iref that is used in sensing data stored in the memory cell transistor MC.

First, the memory cell transistor MC will be explained. The memory cell transistor MC is formed on a well 1a in a substrate 1. More specifically, diffusion layers 60a and 60b which serve as source/drain regions are formed in the substrate 1 (well 1a). The well 1a is a p-type well for example, while the diffusion layers 60a and 60b are n-type doped regions. A contact 10 connected to the diffusion layer 60a is formed on the diffusion layer 60a. Spacers 9 are in contact with the both sides of the contact 10. The spacers 9 are insulating films.

Floating gates 20 are formed on both sides of the contact 10 through the spacers 9. In other words, the spacers 9 are provided between the contact 10 and the floating gates 20 for electrically separating the floating gates 20 from the contact 10. A gate insulating films 2 is formed between the substrate 1 (well 1a) and each of the floating gates 20. The floating gate 20 overlaps with a part of the diffusion layer 60a, and the floating gate 20 and the diffusion layer 60a are capacitively-coupled to each other via the gate insulating films 2. Moreover, a spacer 7 which is an insulating film is formed on the each floating gate 20. Furthermore, a tunnel oxide film 30 is formed in contact with a surface of the floating gate 20 on the opposite side of the spacer 9. As described above, each of the floating gates 20 is surrounded by insulating films, and is electrically isolated from the outside. Depending on the charge amount kept in the floating gate 20, the threshold voltage of the memory cell transistor MC changes.

Further, control gates (selector gates) 50 are formed on respective sides of the floating gates 20 through the tunnel oxide films 30. In other words, each of the control gates 50 is provided on the other side of the contact 10 when viewed from the floating gate 20. Also, the each control gate 50 is formed in contact with the spacer 7. As shown in FIG. 1, the each control gate 50 is formed to partially overlap with the floating gate 20. That is, a part of the control gate 50 overlaps the floating gate 20, and the remaining part is provided on the substrate 1 (well 1a) through the tunnel oxide film 30. The tunnel oxide film 30 is provided not only between the control gate 50 and the floating gate 20 but also between the control gate 50 and the substrate 1 as a gate insulating film. As described above, the memory cell transistor MC in the present embodiment is of the split-gate type. Since the floating gate 20 and a part of the control gate 50 are provided over a channel region, the over-erasing can be prevented.

As explained above, the pair of the floating gates 20 and the pair of the control gates 50 are provided on both sides of the contact 10 connected to the diffusion layer 60a. A pair of the diffusion layers 60b is formed in the substrate 1 (well 1a) on respective sides of the control gates 50. Thus, two bit data can be stored in the split-gate type memory cell structure shown in FIG. 1.

It should be noted that each of the floating gates 20 has a pointed tip section 20a as shown in FIG. 1. The pointed tip section 20a overlaps with the control gate 50 and points from the floating gate 20 toward the control gate 50. In any of the floating gates 20 on both sides of the contact 10, the pointed tip section 20a is formed on the side of the tunnel oxide films 30. Thus, any of the floating gates 20 has an upper concave outer surface angled toward the contact 10. Furthermore, it can be seen from FIG. 1 that the spacers 7 and 9, the contact 10, the floating gates 20, and the control gates 50 are formed in a self-aligned manner. These structural features appear as a result of a specific manufacturing method to be described later.

Next, the reference transistor RT will be explained. The reference transistor RT is formed on a well 101a in the substrate 1. More specifically, diffusion layers 160 which serve as source/drain regions are formed in the substrate 1 (well 101a). The well 101a is a p-type well for example, while the diffusion layers 160 are n-type doped regions. A gate electrode 150 is provided over a region sandwiched between the diffusion layers 160. A gate insulating film 130 is formed between the gate electrode 150 and the substrate 1.

The reference transistor RT according to the present embodiment is a mere MIS transistor. A split-gate type transistor having the same structure as the memory cell transistor MC is not used as the reference transistor RT. In contrast to the memory cell transistor MC, the reference transistor RT does not have a floating-gate-structure. That is to say, the reference transistor RT has only the single gate electrode 150 as the gate structure. Only the single gate electrode 150 is provided over the channel region. A switching of the reference transistor RT is controlled by using only the single gate electrode 50. On the other hand, with respect to the split-gate type memory cell transistor MC, the switching is controlled by both the floating gate 20 and the control gate 50. The split-gate type memory cell transistor MC has a stacked gate structure in which the floating gate 20 and the control gate 50 partially overlap with each other. While on the other hand, the reference transistor RT has a single-layer gate structure consisting of the single gate electrode 150.

The reference transistor RT according to the present embodiment is a MIS transistor that does not have a floating-gate-structure. Therefore, time variation of the threshold voltage of the reference transistor RT due to incomings and outgoings of electrons to the floating-gate-structure can be prevented. As a result, time variation of the reference current Iref used for sensing data is prevented, and the reference current Iref is stabilized. Thus, characteristics and reliability of the nonvolatile memory are improved.

Moreover, the split-gate type memory cell transistor MC according to the present embodiment has a complicated structure, as shown in FIG. 1. If the same one as the memory cell transistor MC is employed as the reference transistor RT, the reference current Iref possibly vary for every reference transistor RT because of manufacturing variability. According to the present embodiment, a MIS transistor having a simple structure instead of the memory cell transistor MC having the complicated structure is employed as the reference transistor RT. Therefore, variation of the reference current Iref caused by the manufacturing variability is prevented. As a result, the characteristics and reliability of the nonvolatile memory are improved.

It may be considered to connect the floating gate 20 with an external contact in order to prevent the variation of the threshold voltage caused by the variation of the charge amount. However, the memory cell transistor MC in the present embodiment has the complicated structure as shown in FIG. 1, and it is not practical to form such a contact connected to the floating gate 20. Moreover, if such external contacts connected with the floating gates 20 are newly provided, it is not possible to reduce the memory cell size, which causes increase in an area of the memory cell array.

2. Operation

Figure 2:
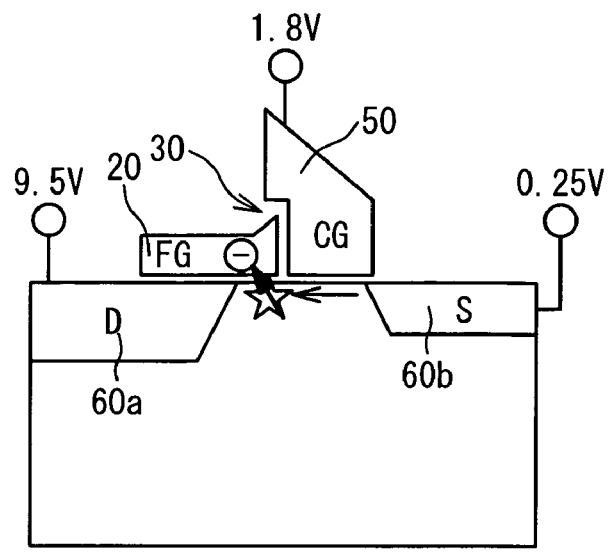
FIG. 2 is a conceptual diagram showing a program operation in the present embodiment.

Next, description is given on an operation example of the nonvolatile memory according to the present embodiment. FIG. 2 conceptually shows a program operation. The programming is carried out through a CHE (Channel Hot Electron) method. In this case, the diffusion layer 60b serves as a source, while the diffusion layer 60a serves as a drain. For example, voltages of +1.8 V, about 0.25 V, and +9.5 V are applied to the control gate 50 (CG), the source 60b, and the drain 60a, respectively. Electrons emitted from the source 60b are accelerated by an intense electric field at the channel region to be channel hot electrons. In particular, potential of the floating gate 20 is high as a result of the coupling between the drain 60a and the floating gate 20, and thus an intense electric field is generated at a narrow gap between the control gate 50 and the floating gate 20. High-energy channel hot electrons generated by the intense electric field are injected into the floating gate 20 (FG) through the gate insulating film 2. Such an injection is called as an SSI (Source Side Injection). The SSI makes it possible to improve efficiency of the electron injection and thus to set the programming current to low levels. As a result of the injection of the electrons into the floating gate 20, the threshold voltage of the memory cell transistor MC is increased.

Figure 3:
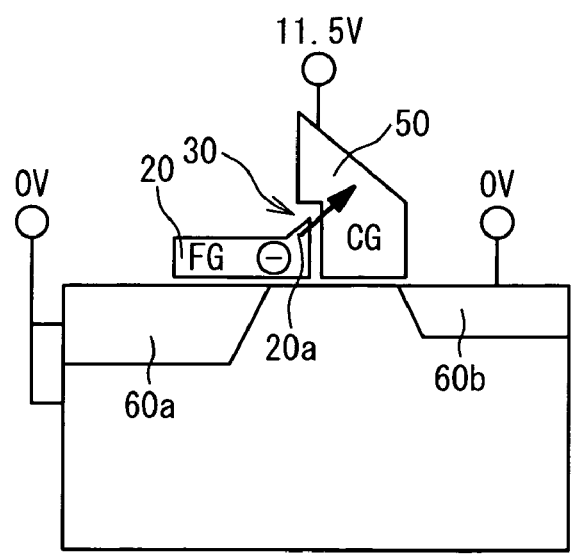
FIG. 3 is a conceptual diagram showing an erase operation in the present embodiment.

FIG. 3 conceptually shows an erase operation. The erasing is carried out through the FN (Fowler-Nordheim) tunnel method. For example, a voltage of +11.5 V is applied to the control gate 50, and the voltages applied to the diffusion layers 60a and 60b and the substrate 1 are set to 0 V. As a result, a high voltage is applied to the tunnel oxide film 30 between the control gate 50 and the floating gate 20, and thereby an FN tunnel current flows through the tunnel oxide film 30. Consequently, electrons are drawn out of the floating gate 20 toward the control gate 50 through the tunnel oxide film 30. In particular, an intense electric field is generated around the pointed tip section 20a of the floating gate 20 due to its peculiar shape, and the electrons mainly moves from the pointed tip section 20a to the control gate 50. The pointed tip section 20a with which the intense electric field is generated plays a role of improving efficiency of the electron drawing. As a result of the drawing of the electrons out of the floating gate 20, the threshold voltage of the memory cell transistor MC is decreased. It should be noted that if the threshold voltage with respect to the floating gate 20 becomes negative due to over-erasing, a channel can be generated at all times under the floating gate 20. However, it is prevented that the memory cell transistor MC is always on, because the control gate 50 is also provided on the channel region according to the present structure. Thus, the split-gate nonvolatile memory has an advantage that errors due to the over-erasing are prevented.

Figure 4:
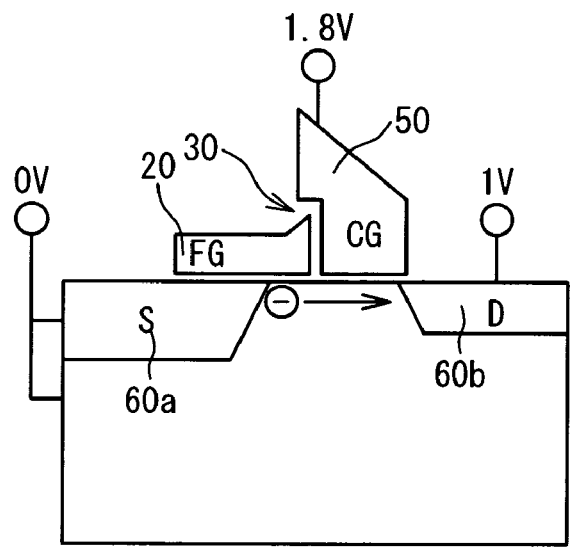
FIG. 4 is a conceptual diagram showing a read operation in the present embodiment.

FIG. 4 conceptually shows a read operation. At the time of reading, the diffusion layer 60a serves as a source, while the diffusion layer 60b serves as a drain. For example, voltages of +1.8 V and +1 V are applied to the control gate 50 and the drain 60b, respectively. Voltages applied to the source 60a and the substrate 1 are set to 0 V. In a case of an erased cell, its threshold voltage is low and a read current Icell flows. In a case of a programmed cell, on the other hand, its threshold voltage is high and the read current Icell does not flow (Icell=0). By detecting the read current Icell, it is possible to determine whether a read target cell is the programmed cell or the erased cell.

Figure 5:
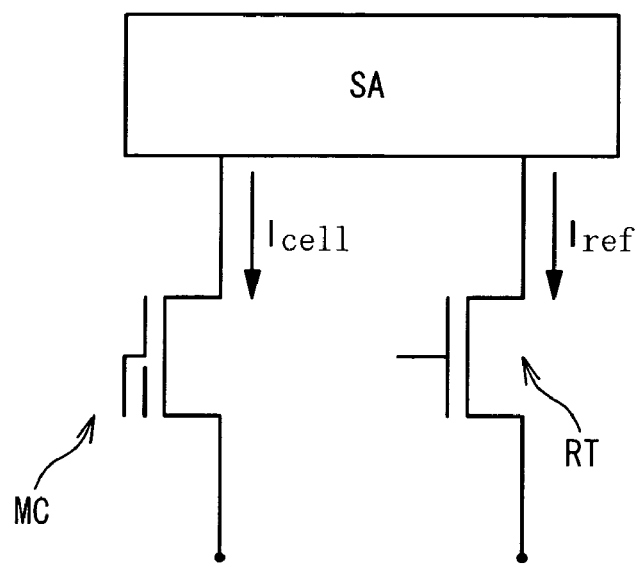
FIG. 5 is a circuit diagram showing a configuration of the nonvolatile memory according to the present embodiment.

In FIG. 5, a sense amplifier SA is connected to the memory cell transistor MC and the reference transistor RT. The sense amplifier SA makes a comparison between the read current Icell from the memory cell transistor MC and the reference current Iref from the reference transistor RT. The reference current Iref is set to be smaller than the read current Icell flowing through the erased cell. If the read current Icell is larger than the reference current Iref, the read target cell is the erased cell. On the other hand, if the read current Icell is smaller than the reference current Iref, the read target cell is the programmed cell. In this manner, the sense amplifier SA senses data of the memory cell transistor MC. According to the present embodiment as stated above, the time variation of the reference current Iref is prevented and the manufacturing variability of the reference current Iref is suppressed. Consequently, data read properties are improved.

3. Manufacturing Method 3-1. Memory Cell Transistor

Figure 6A:
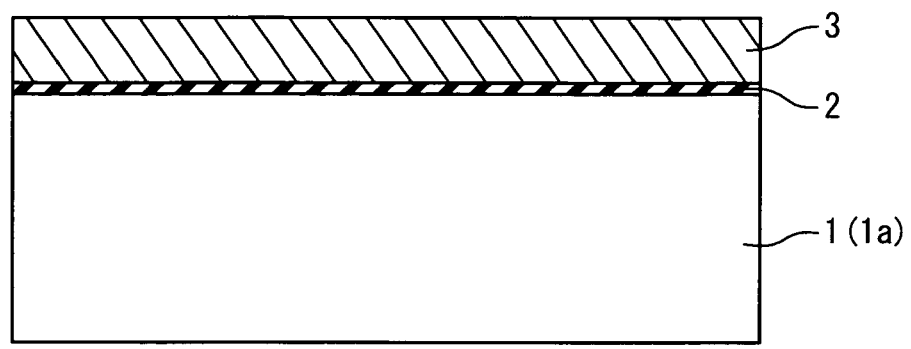
FIGS. 6A to 6O are cross sectional views showing a manufacturing process of a memory cell transistor according to the present embodiment.

With reference to FIGS. 6A to 6O, a description is given below on one example of processes of manufacturing the memory cell transistor MC in the present embodiment. First, a silicon substrate is initially provided as a substrate 1, and a p-type well 1a is formed in the substrate 1. Then, as shown in FIG. 6A, a gate insulating film 2 is formed on the substrate 1 (p-type well 1a). After that, a first gate polysilicon film 3 is formed on the gate insulating film 2. As described later, the first gate polysilicon film 3 becomes the floating gate 20.

Figure 6B:
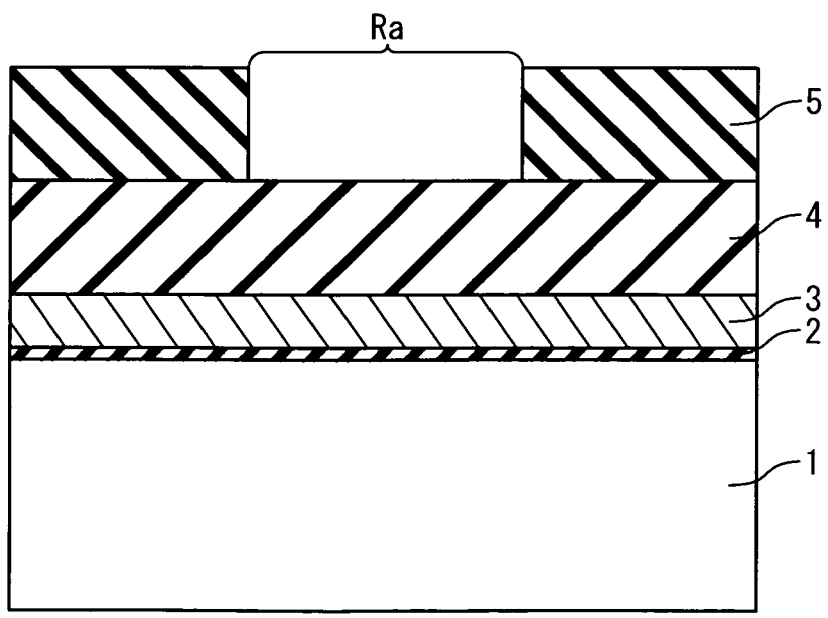

Next, as shown in FIG. 6B, a nitride film 4 is deposited on the first gate polysilicon film 3. Further, after resist is provided over an entire surface, a resist mask 5 having a predetermined pattern is formed on the nitride film 4 with the use of the photolithography technology. The resist mask 5 has an opening at a region Ra.

Figure 6C:
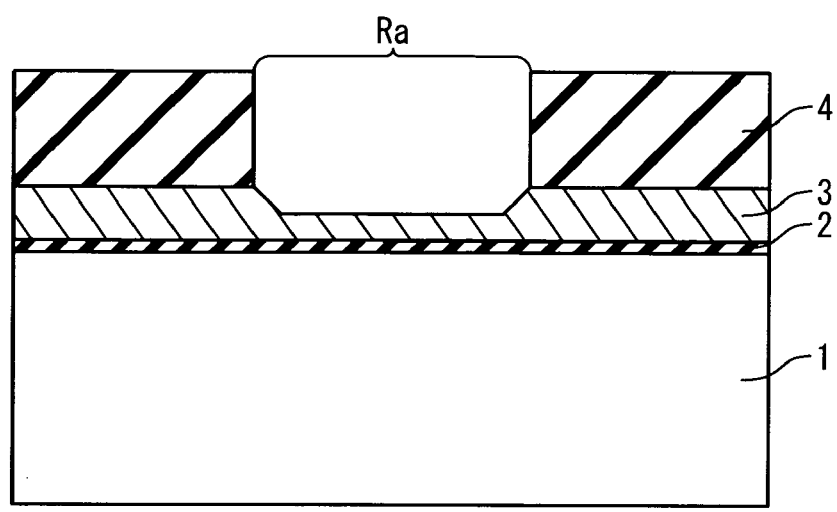

Next, etching of the nitride film 4 and isotropic etching of a part of the first gate polysilicon film 3 are performed with the use of the resist mask 5. As a result, all of the nitride film 4 in the region Ra and a part of the first gate polysilicon film 3 in the region Ra are removed as shown in FIG. 6C. The first gate polysilicon film 3 after the isotropic etching has sloped edges, and the sloped edges serve as the pointed tip sections 20a of the floating gates 20.

Figure 6D:
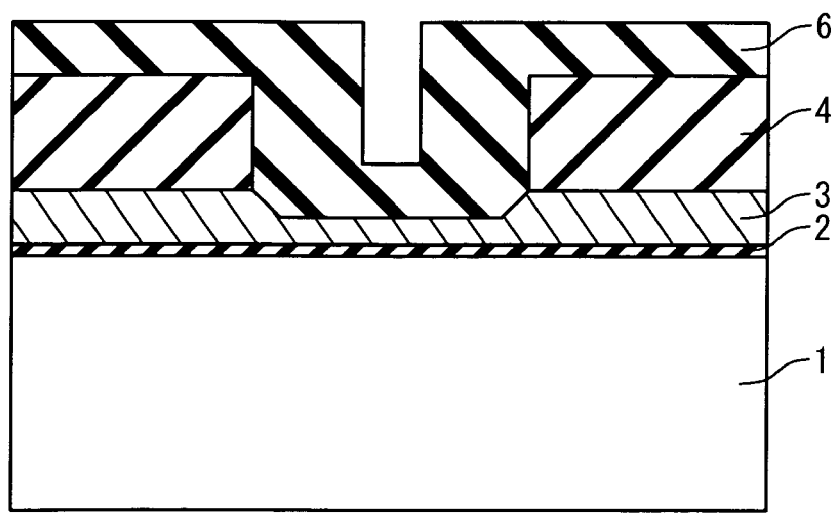
Figure 6E:
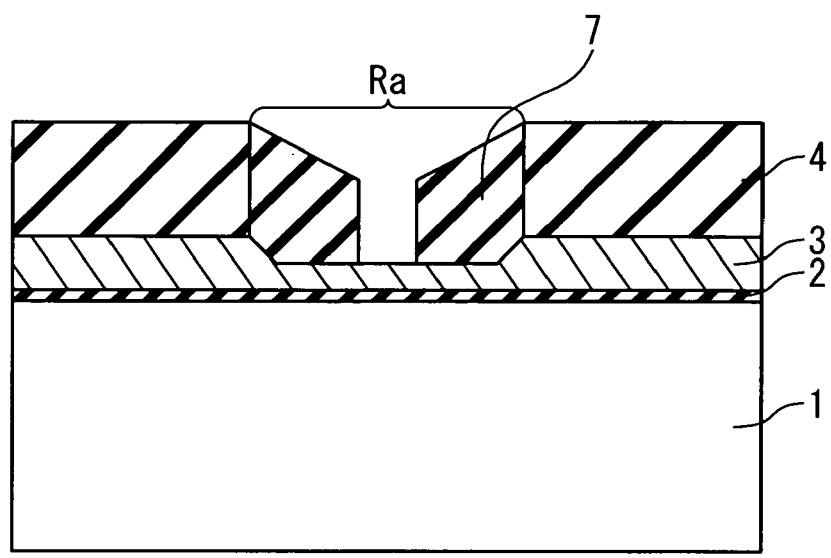

Next, as shown in FIG. 6D, a first oxide film 6 is deposited over an entire surface. After that, the first oxide film 6 is etched-back, and thus first spacers 7 are formed in a self-aligned manner, as shown in FIG. 6E. More specifically, a pair of first spacers 7 is formed on the part of the first gate polysilicon film 3 in the region Ra. The two first spacers 7, facing each other, are in contact with the side surfaces of the nitride films 4, respectively.

Figure 6F:
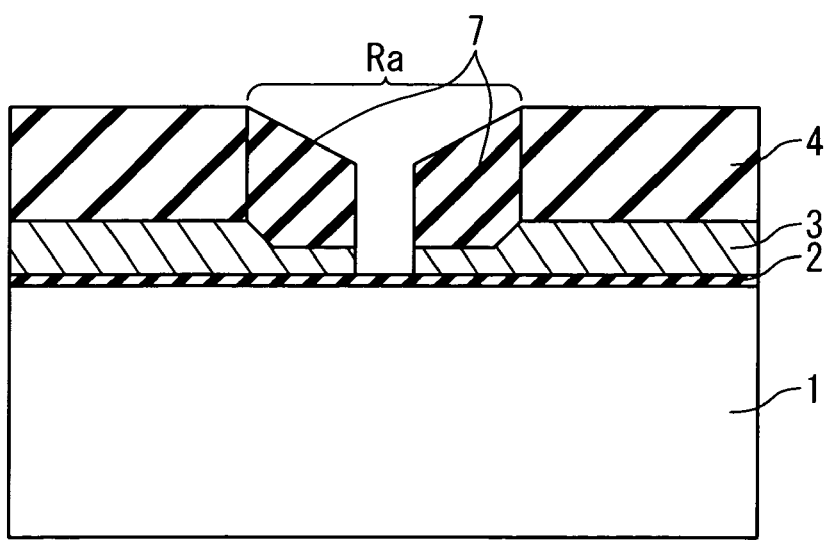

Next, an etching process is performed by using the first spacers 7 as a mask. As a result, the exposed part of the first gate polysilicon film 3 in the region Ra is removed as shown in FIG. 6F.

Figure 6G:
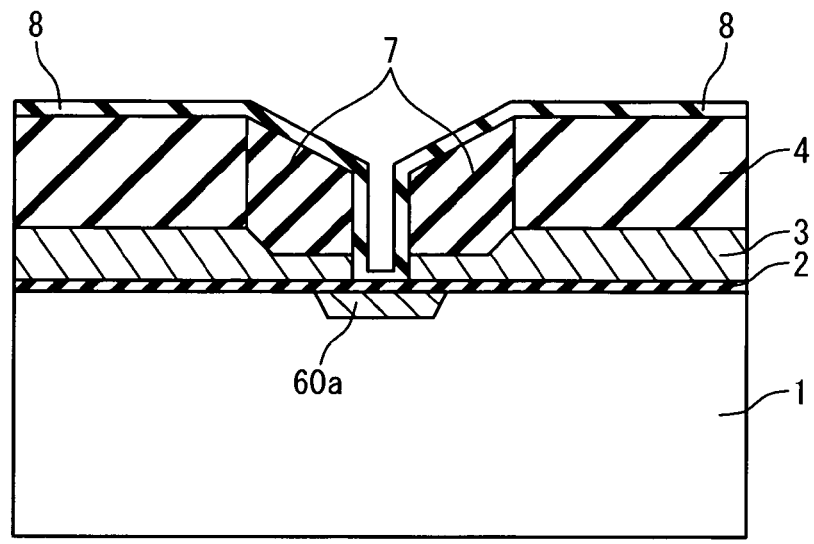
Figure 6H:
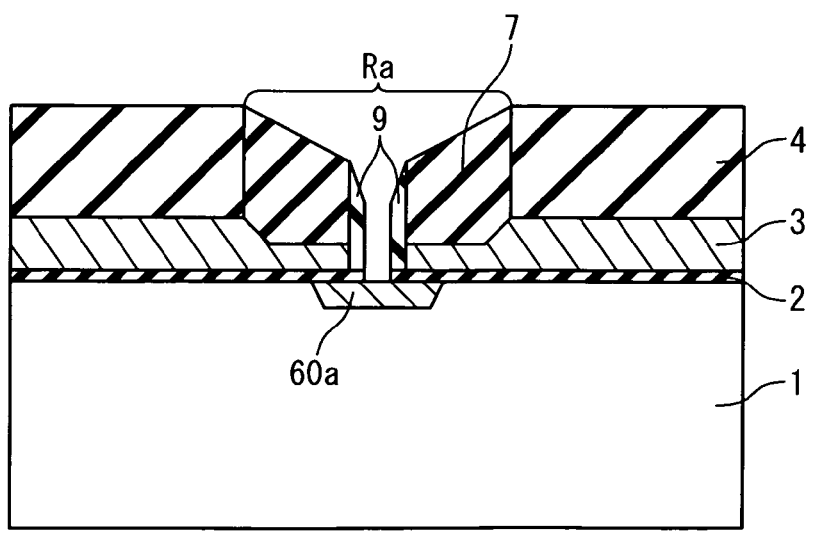
Figure 6:
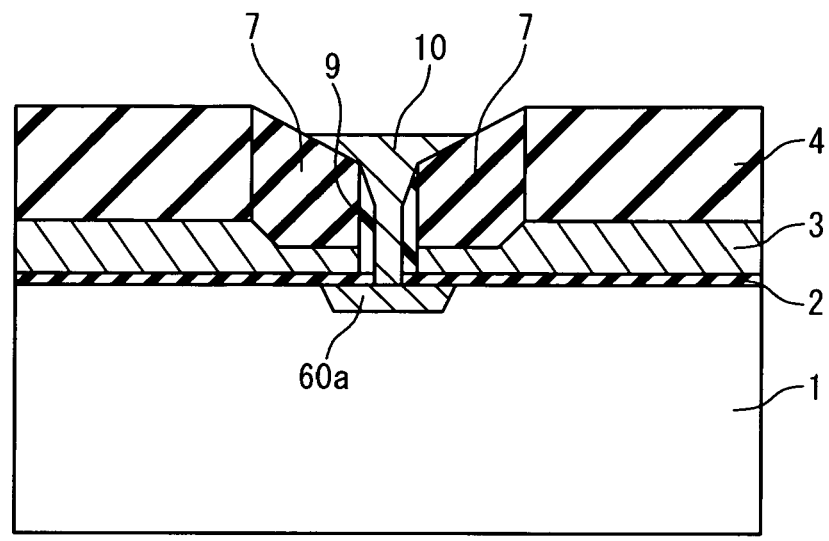
Figure 6:
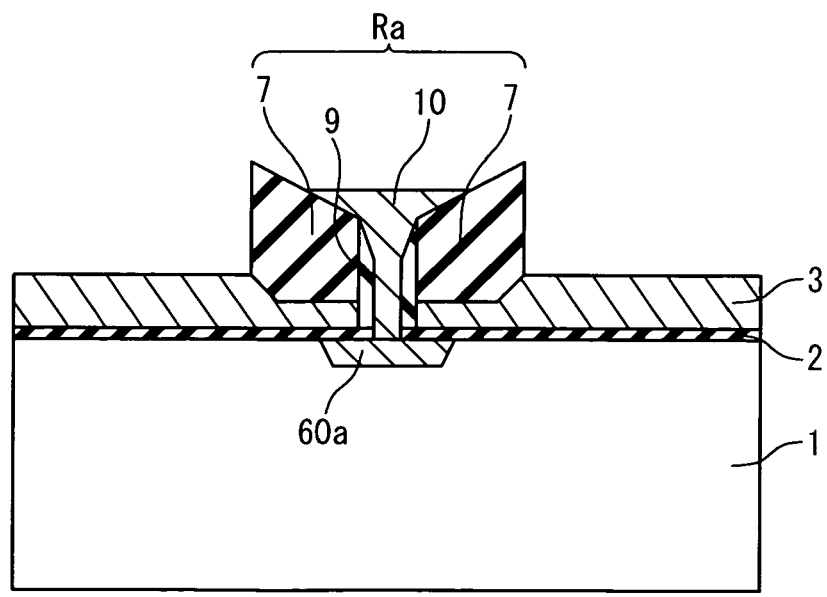

Next, an ion implantation process is performed with respect to a part of the region Ra. Consequently, as shown in FIG. 6G, a diffusion layer 60a to be a source or a drain is formed in the p-type well 1a. Also, a second oxide film 8 is deposited over an entire surface. After that, the second oxide film 8 is etched-back and thus second spacers 9 are formed in a self-aligned manner as shown in FIG. 6H. More in detail, a pair of second spacers 9 is formed to face each other in the region Ra. Each of the second spacers 9 is in contact with a side surface of the first spacer 7 and a side surface of the first gate polysilicon film 3.

Next, a polysilicon film is deposited over an entire surface, and then the CMP (Chemical Mechanical Polishing) is performed. As a result, a contact 10 sandwiched between the second spacers 9 is formed as shown in FIG. 6I.

Figure 6K:
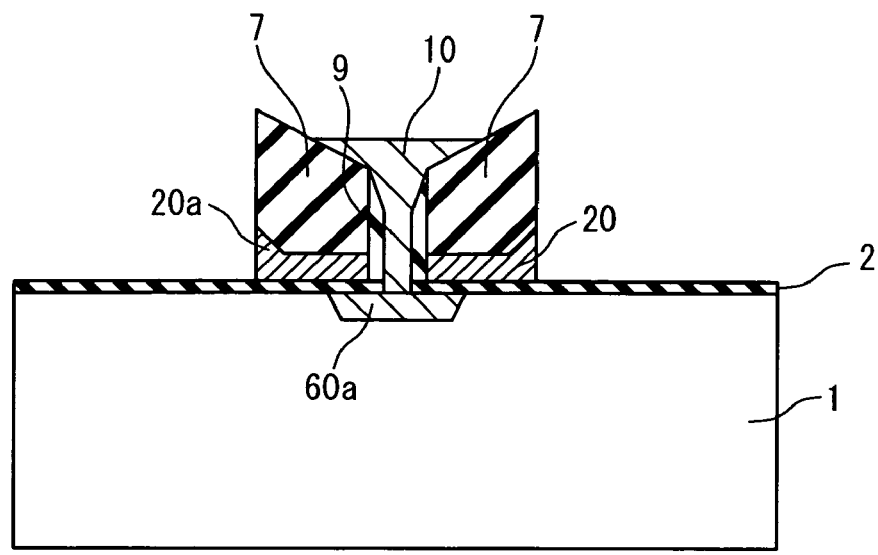

Next, as shown in FIG. 6J, the nitride film 4 outside the region Ra is removed by an etching process. Further, as shown in FIG. 6K, the first gate polysilicon film 3 outside the region Ra is removed by an etching process using the first spacers 7 as a mask. As a result, a pair of floating gates 20 is formed under the pair of first spacers 7 in a self-aligned manner. The pair of the floating gates 20 is formed on both sides of the contact 10 through the second spacers 9. Additionally, the pointed tip sections 20a are formed at the edges of the floating gates 20, and any of the floating gates 20 has an upper concave outer surface angled toward the contact 10.

Figure 6L:
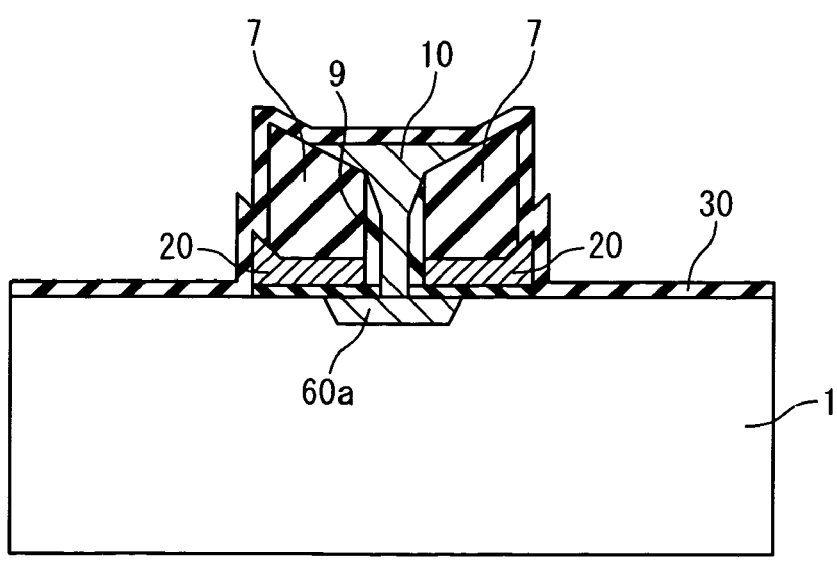
Figure 6M:
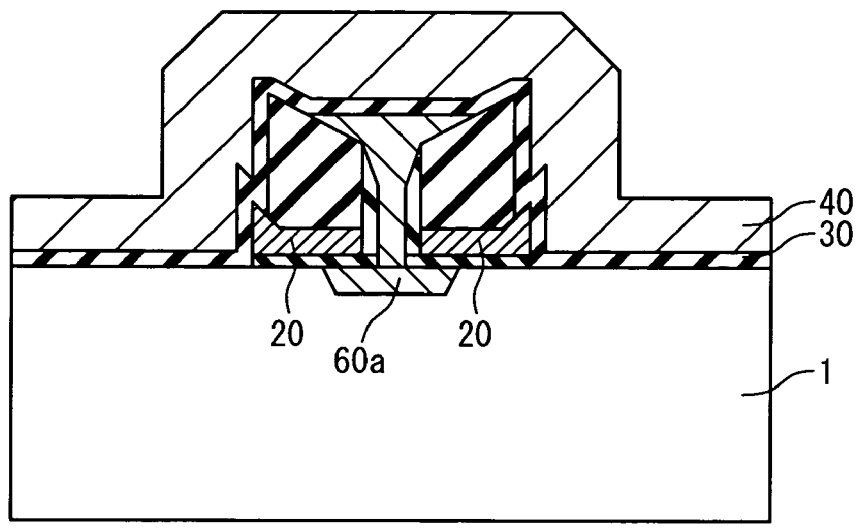
Figure 6N:
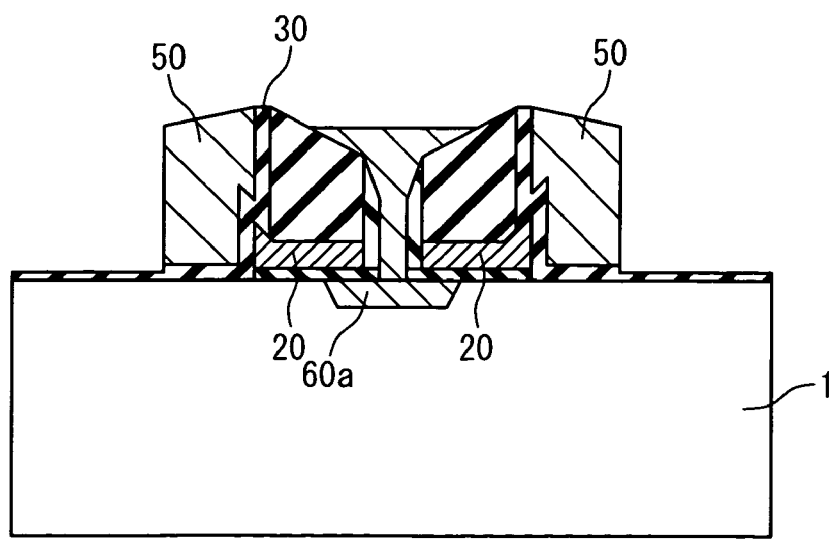
Figure 60:
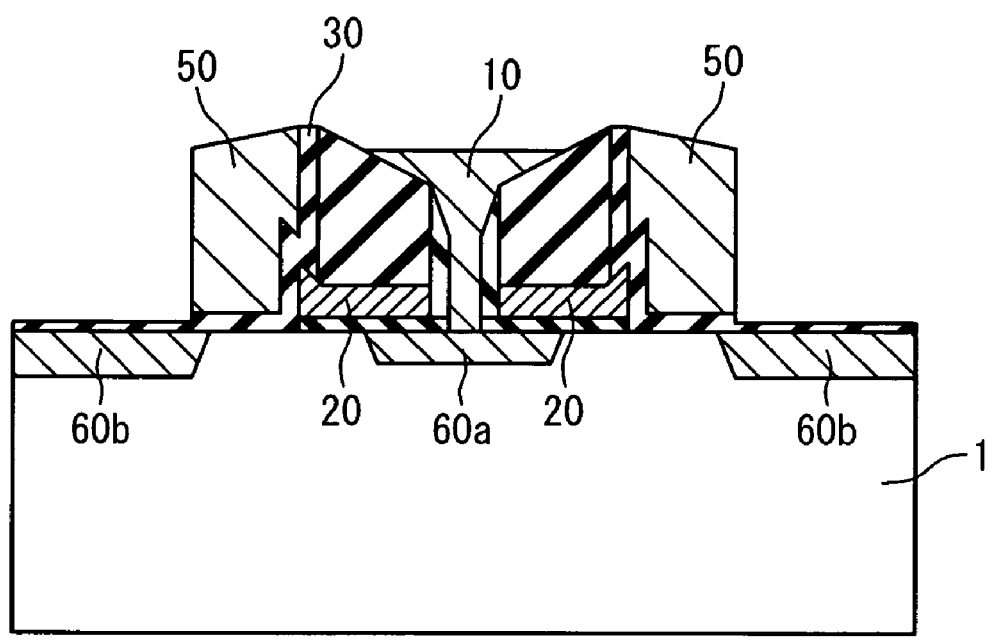

Next, the gate insulating film 2 is removed, and then a tunnel oxide film 30 is formed over an entire surface as shown in FIG. 6L. Further, as shown in FIG. 6M, a second gate polysilicon film 40 is formed over an entire surface. After that, an etching-back of the second gate polysilicon film 40 is performed. As a result, control gates 50 are formed in a self-aligned manner as shown in FIG. 6N. The control gates 50 are formed on respective sides of the floating gates 20 through the tunnel oxide films 30. The etching is performed such that surfaces of the control gates 50 become convex.

Next, an ion implantation process with using the floating gates 20 and the control gates 50 as a mask is performed. As a result, diffusion layers 60b to be a source or a drain are formed in the p-type well 1a, as shown in FIG. 6O.

In this manner, the split-gate type memory cell transistor MC shown in FIG. 1 is formed. According to the manufacturing processes explained above, use of the photolithography technology is suppressed as possible, and most of the components are formed in a self-aligned manner by using the etching-back process. Since the number of uses of the photolithography technology is reduced, the manufacturing processes become simplified. Furthermore, it is possible to reduce the size of a memory cell.

3-2. Reference Transistor (1)

With reference to FIGS. 7A to 7C, a description is given below on a first embodiment of processes of manufacturing the reference transistor RT. For example, after the above-mentioned memory cell transistor MC is formed in a first region R1, a reference transistor RT is formed in a second region R2.

More in detail, a p-type well 101a is formed in the substrate 1, and a gate insulating film 130 is formed on the p-type well 101a, as shown in FIG. 7A. Here, the p-type well 101a and the above-mentioned p-type well 1a may be identical to each other. After that, a gate polysilicon film 140 is deposited over the gate insulating film 130. Further, after resist is applied over the entire surface, a resist mask having a predetermined pattern is formed over the surface with the use of the photolithography technology. The resist mask 71 formed in the first region R1 covers whole of the memory cell transistor MC. On the other hand, the resist mask 141 formed in the second region R2 remains only on a region where the gate electrode is formed.

Next, the gate polysilicon film 140 is etched with the use of the resist mask 141. After the resist masks 71 and 141 are removed, a structure shown in FIG. 7B is obtained. In FIG. 7B, a single gate electrode 150 is formed on the p-type well 101a through the gate insulating film 130. The memory cell transistor MC has a stacked gate structure in which the floating gate 20 and the control gate 50 partially overlap with each other, while the reference transistor RT has a single-layer gate structure consisting of the single gate electrode 150. Therefore, the time variation of the reference current Iref is prevented, and the characteristics and reliability of the nonvolatile memory are improved.

Next, a mask 72 covering whole of the memory cell transistor MC is formed in the first region R1, as shown in FIG. 7C. After that, an ion implantation process is performed by using the mask 72 and the above-mentioned gate electrode 150 as masks. As a result, diffusion layers 160 of the reference transistor RT are formed in the p-type well 101a in the second region R2. In this manner, the reference transistor RT in the present embodiment is formed.

The reference transistor RT may be formed concurrently with a logic transistor LT used in a logic circuit. That is to say, manufacturing processes for the logic transistor LT may be identical to manufacturing processes for the reference transistor RT. In that case, the logic transistor LT is formed in a third region R3 through the same manufacturing processes as shown in FIGS. 7A to 7C. The reference transistor RT and the logic transistor LT thus manufactured are both mere MIS transistors and have the same structure. Since the logic transistor LT and the reference transistor RT are manufactured simultaneously, the time required for the manufacturing can be reduced.

3-3. Reference Transistor (2)

The reference transistor RT can also be formed by utilizing a part of the manufacturing processes for the memory cell transistor MC. That is to say, it is possible to form the reference transistor RT concurrently with the memory cell transistor MC. With reference to FIGS. 8A to 8D, a description is given below on a second embodiment of processes of manufacturing the reference transistor RT.

FIG. 8A shows a state in which the structure shown in the foregoing FIG. 6K is formed in the first region R1 and then the gate insulating film 2 is removed. That is, the floating gates 20 of the memory cell transistor MC are being formed in the first region R1. In the meantime, the second region R2 where the reference transistor RT is formed changes in the same way as the region outside the above-mentioned region Ra (see FIGS. 6A to 6J), to be the state shown in FIG. 8A.

Next, as shown in the foregoing FIG. 6L, the tunnel oxide film 30 is formed over the entire surface. At the same time, as shown in FIG. 8B, the tunnel oxide film 30 is formed on the p-type well 101a (substrate 1) in the second region R2 as well. The tunnel oxide film 30 in the second region R2 becomes the gate insulating film 130 of the reference transistor RT.

Next, as shown in the foregoing FIG. 6M, the second gate polysilicon film 40 is formed over the entire surface. At the same time, as shown in FIG. 8B, the second gate polysilicon film 40 is formed on the tunnel oxide film 30 in the second region R2 as well. The second gate polysilicon film 40 in the second region R2 becomes the gate electrode 150 of the reference transistor RT. The resist mask 141 is formed on a region where the gate electrode 150 is to be formed.

Next, an etching process of the second gate polysilicon film 40 is performed. At this time, the control gates 50 are formed in the first region R1 as shown in FIGS. 6N and 8C. At the same time, the single gate electrode 150 is formed in the second region R2 as shown in FIG. 8C. The memory cell transistor MC has the stacked gate structure in which the floating gates 20 and the control gates 50 partially overlap with each other, while the reference transistor RT has the single-layer gate structure consisting of the single gate electrode 150. Therefore, the time variation of the reference current Iref is prevented, and the characteristics and reliability of the nonvolatile memory are improved.

Next, an ion implantation process is performed by using the floating gates 20, the control gates 50 and the gate electrode 150 as masks. As a result, the diffusion layers 60b of the memory cell transistor MC are formed in the p-type well 1a in the first region R1, as shown in FIGS. 6O and 8D. At the same time, the diffusion layers 160 of the reference transistor RT are formed in the p-type well 101a in the second region R2.

The reference transistor RT thus manufactured has the following features. First of all, material and film quality of the gate electrode 150 are the same as those of the control gates 50 of the memory cell transistor MC. Also, material and thickness of the gate insulating film 130 are the same as those of the tunnel oxide film 30 of the memory cell transistor MC. Moreover, impurity concentration distribution in the diffusion layers 160 of the reference transistor RT is equal at least to that in the diffusion layers 60*b* of the memory cell transistor MC. Furthermore, if the p-type well 101*a* of the reference transistor RT and the p-type well 1*a* of the memory cell transistor MC are formed by the same process, impurity concentration distribution in the p-type well 101*a* is equal to that in the p-type well 1*a*. The p-type well 101*a* and the p-type well 1*a* may be common.

Figure 9A:
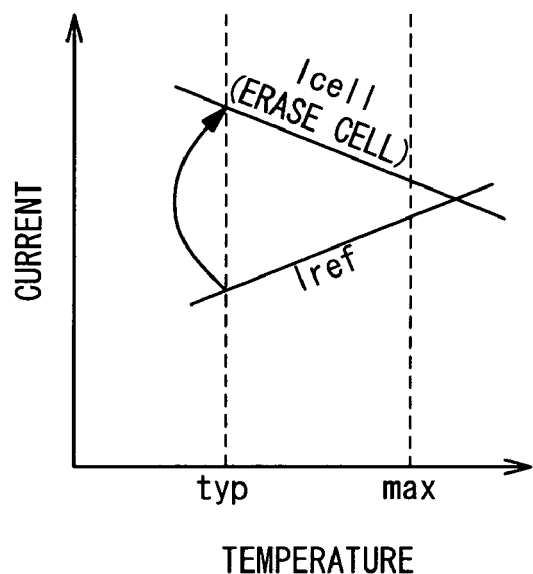
FIG. 9A is a graph showing an example of temperature characteristics of a nonvolatile memory.
Figure 9B:
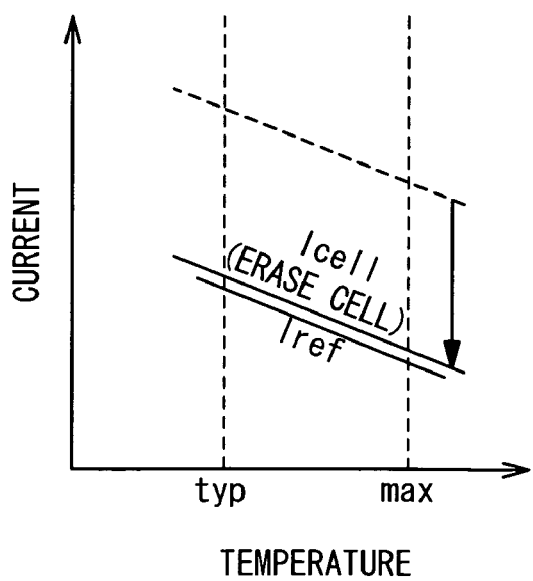
FIG. 9B is a graph showing an example of temperature characteristics of the nonvolatile memory according to the second embodiment.

According to the second embodiment as stated above, properties of elements of the reference transistor RT are the same as those of the corresponding elements of the memory cell transistor MC (transistor with the control gates 50), respectively. As a result, the characteristics of the reference transistor RT become equivalent to those of the memory cell transistor MC. The resultant effects, namely, effects peculiar to the second embodiment are explained below with reference to FIGS. 9A and 9B. FIGS. 9A and 9B both show current-temperature characteristics. The horizontal axis shows the temperature, while the vertical axis shows the read current Icell from an erased cell and the reference current Iref from the reference transistor RT.

FIG. 9A shows a case where the memory cell transistor MC and the reference transistor RT are manufactured by separate processes. In this case, it is difficult to make the characteristics of the memory cell transistor MC exactly the same as those of the reference transistor RT. As shown in FIG. 9A, for example, the read current Icell decreases as the temperature increases. On the other hand, it could be that the reference current Iref increases as the temperature increases. In order to achieve a proper sense operation, the read current Icell should be larger than the reference current Iref. It is therefore necessary to design the read current Icell under a condition of a typical temperature (typ) to be an extremely large value, in order to guarantee an operation under a condition of a temperature (max) that is the worst condition. In other words, it is necessary to set a broad margin in prospect of the variation of the read current Icell caused by temperature change. This makes the circuit designing difficult. Moreover, such the broad margin causes an increase in power consumption and a decrease in operation speed.

On the other hand, FIG. 9B shows a case of the second embodiment, namely a case where the memory cell transistor MC and the reference transistor RT are concurrently manufactured by the same processes. In this case, the memory cell transistor MC and the reference transistor RT have equivalent characteristics. As shown in FIG. 9B, for example, both of the read current Icell and the reference current Iref decrease as the temperature increases. Therefore, a proper sense operation can be achieved over a wide range of temperature (typ to max), if the read current Icell is slightly larger than the reference current Iref. Since an excessive margin is not necessary, the circuit designing becomes easier and the decrease in the operation speed is prevented. In addition, the power consumption can be reduced, because it is possible to design the read current Icell to be small. The same applies to current-voltage characteristics as well as the current-temperature characteristics. As explained above, the second embodiment is preferable in view of the current-temperature characteristics and the current-voltage characteristics.

In the case of the split-gate type, the control gate 50 is used for the switching of the memory cell transistor MC. Therefore, it is particularly important in view of the read operation to make the characteristics of a transistor relevant to the control gate 50 consistent with the characteristics of the reference transistor RT. This is possible according to the second embodiment, as stated above. The reason is that the formation of the control gate 50 is independently performed after the formation of the floating gate 20 in the case of the split-gate type (see FIGS. 6K to 6N). By utilizing the manufacturing processes for the control gate 50, the reference transistor RT can also be manufactured at the same time. As a result, the characteristics of the transistor relevant to the control gate 50 coincide with those of the reference transistor RT. Moreover, the time required for manufacturing is reduced. It can be said that the manufacturing method according to the second embodiment goes along extremely well with the split-gate type memory cell transistor MC.

3-4. Reference Transistor (3)

In the second embodiment, a logic transistor LT used in a logic circuit may further be manufactured. The logic transistor LT can be formed concurrently with the above-mentioned reference transistor RT through the completely same processes. In that case, the manufactured reference transistor RT and logic transistor LT have substantially the same characteristics. Alternatively, the logic transistor LT may be manufactured independent of the reference transistor RT, if processing accuracy for the logic transistor LT is required to be higher than processing accuracy for the reference transistor RT. An example of the processes in the latter case will be explained below.

Figure 10A:
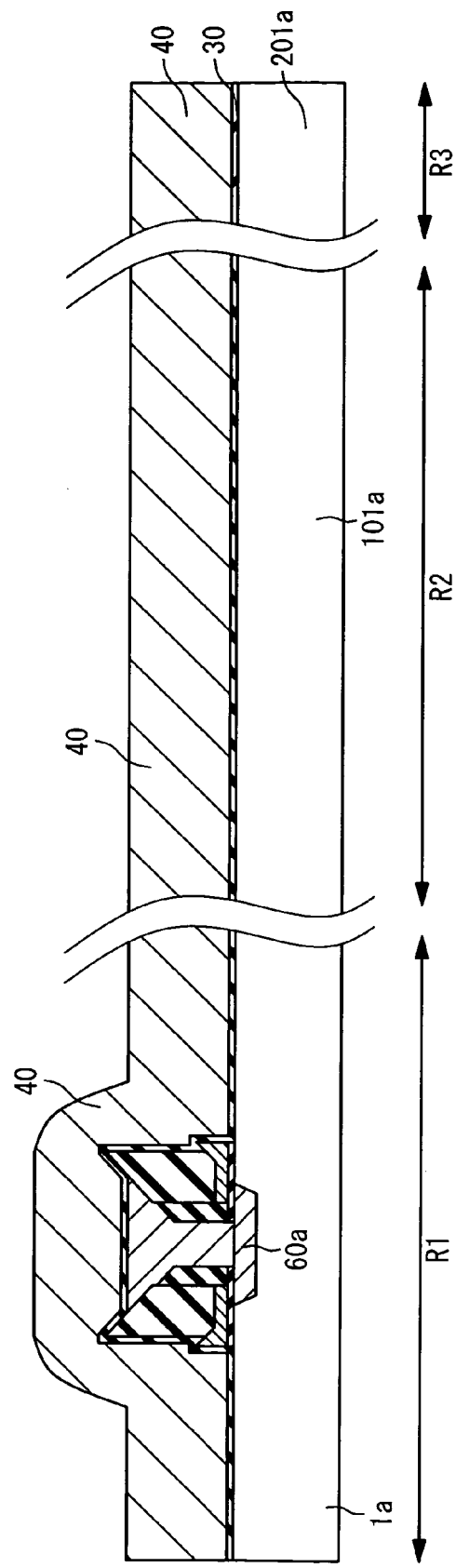
Figure 10B:
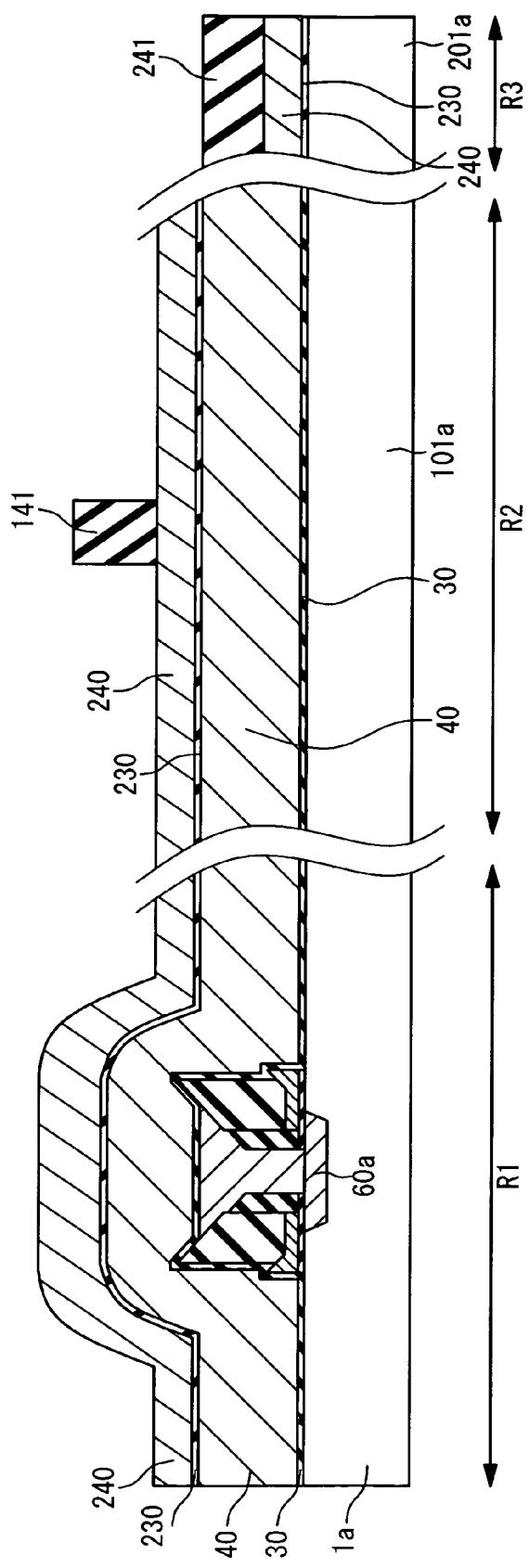

FIG. 10A shows a state in which the tunnel oxide film 30 and the second gate polysilicon film 40 are formed over the entire surface as shown in the foregoing FIG. 8B. At this time, the tunnel oxide film 30 and the second gate polysilicon film 40 are formed in the third region R3 where the logic transistor LT is formed, as in the case of the second region R2. Then, the second gate polysilicon film 40 and the tunnel oxide film 30 in the third region R3 are removed by an etching process. After that, a gate insulating film 230 and a gate polysilicon film 240 are deposited in order over an entire surface, as shown in FIG. 10B. Further, in the second region R2, the resist mask 141 is formed on a region where the gate electrode 150 of the reference transistor RT is to be formed. Additionally, the third region R3 where the logic transistor LT is to be formed is wholly covered with a resist mask 241.

Figure 10C:
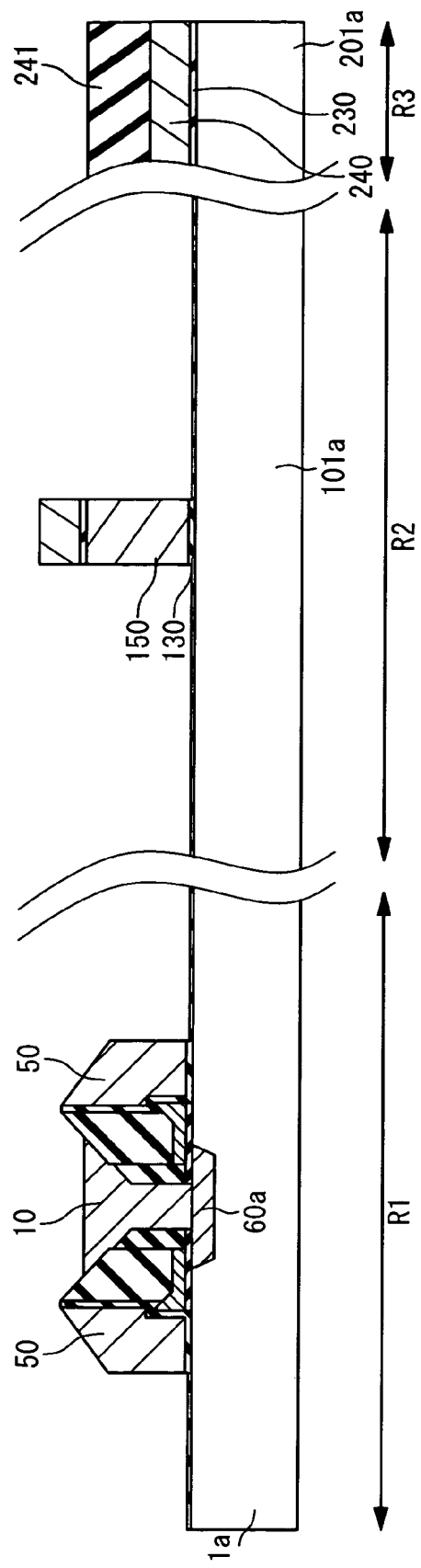

Next, a gate etching process is performed with respect to the first region R1 and the second region R2. Consequently, as shown in FIG. 10C, the control gates 50 of the memory cell transistor MC are formed in the first region R1. At the same time, the gate electrode 150 of the reference transistor RT is formed in the second region R2. The gate insulating film 230 and the gate polysilicon film 240 remain on the gate electrode 150 of the reference transistor RT, which do not affect the operation of the reference transistor RT. A contact for the gate electrode 150 of the reference transistor RT can be formed to penetrate through the gate polysilicon film 240 and the gate insulating film 230.

Figure 10E:
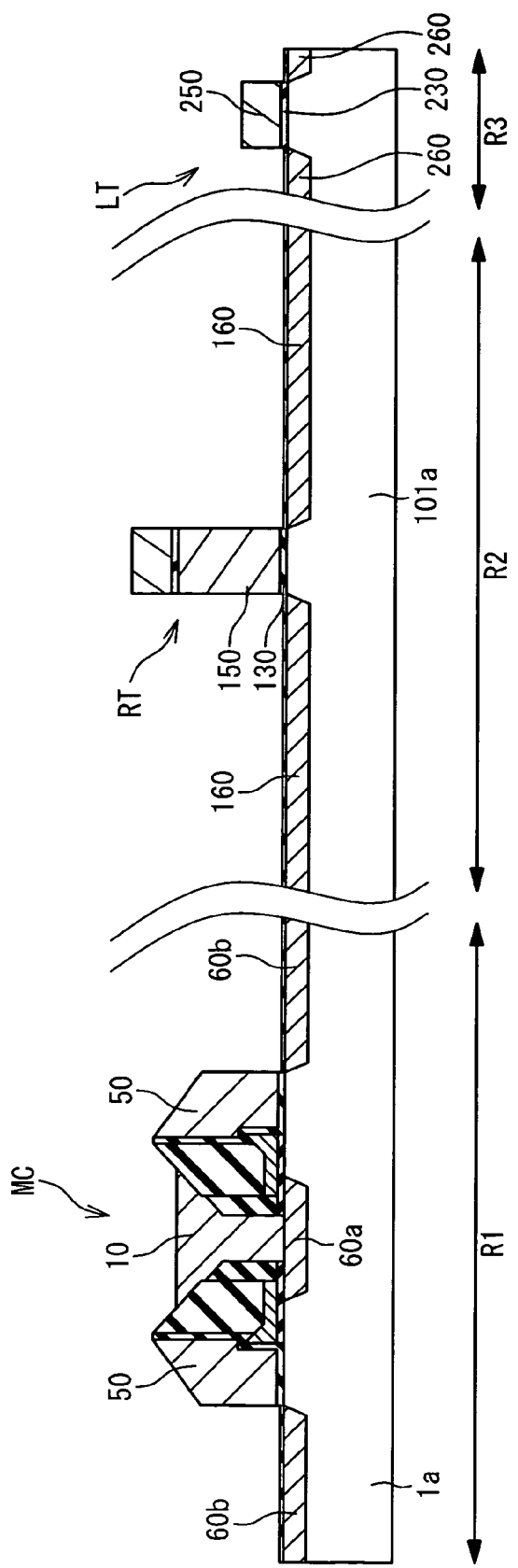

Next, a gate etching process is performed for the third region R3. More specifically, as shown in FIG. 10D, a resist mask 242 is formed on a region where a gate electrode 250 of the logic transistor LT is to be formed. On the other hand, the first region R1 and the second region R2 are wholly covered with a resist mask 142. Then, an etching process is performed for the gate polysilicon film 240 in the third region R3. As a result, the gate electrode 250 of the logic transistor LT is formed on a p-type well 201a through the gate insulating film 230, as shown in FIG. 10E. In FIG. 10E, the resist masks 142 and 242 are removed.

After that, an ion implantation process is performed by using the control gates 50, the gate electrode 150 and the gate electrode 250 as masks. As a result, the diffusion layers 60b of the memory cell transistor MC are formed in the p-type well 1a in the first region R1. At the same time, the diffusion layers 160 of the reference transistor RT are formed in the p-type well 101a in the second region R2. Also, diffusion layers 260 of the logic transistor LT are formed in the p-type well 201a in the third region R3. The reference transistor RT formed through the present manufacturing method can also provide the same effects as in the second embodiment.

In summary, the method of manufacturing a semiconductor memory device according to the present invention includes the processes of: (A) forming a memory cell transistor of a split-gate type on a substrate; and (B) forming a reference transistor on the substrate. The reference transistor is used for generating a reference current that is used in sensing data stored in the memory cell transistor.

The above-mentioned (B) process includes the processes of: (B1) forming a gate insulating film on the substrate; (B2) depositing a polysilicon film on the gate insulating film; (B3) etching the polysilicon film by using a mask having a pattern, to form a single gate electrode; and (B4) forming a first diffusion layer in the substrate through an ion implantation with using the single gate electrode as a mask.

The above-mentioned (A) process includes the processes of: (A0) forming a floating gate on the substrate through an insulating film; (A1) depositing the gate insulating film over an entire surface, concurrently with the process (B1); (A2) depositing the polysilicon film over an entire surface, concurrently with the process (B2); (A3) etching-back the polysilicon film to form a control gate, concurrently with the process (B3); and (A4) forming a second diffusion layer in the substrate through the ion implantation with using the floating gate and the control gate as a mask, concurrently with the process (B4).

The above-mentioned (A0) process includes the processes of: (a1) forming a first polysilicon film on the substrate through the insulating film; (a2) forming a nitride film on the first polysilicon film; (a3) removing whole of the nitride film and a part of the first polysilicon film in a first region by an etching; (a4) depositing a first oxide film over an entire surface; (a5) etching-back the first oxide film, to form a first spacer on the part of the first polysilicon film in the first region in a self-aligned manner; (a6) etching the first polysilicon film in the first region with using the first spacer as a mask; (a7) depositing a second oxide film over an entire surface; (a8) etching-back the second oxide film, to form a second spacer adjacent the first polysilicon film in the first region in a self-aligned manner; (a9) removing the nitride film outside the first region; and (a10) etching the first polysilicon film outside the first region by using the first spacer as a mask, to form the floating gate in a self-aligned manner.

In the above-mentioned (B) process, a logic transistor used in a logic circuit can be formed simultaneously with the reference transistor.

The method of manufacturing may further include the process of: (C) forming a logic transistor on the substrate that is used in a logic circuit. The (C) process includes: (C1) removing the polysilicon film and the gate insulating film from a region where the logic transistor is formed, after the (B1), (B2) processes; (C2) forming a second gate insulating film and a second polysilicon film in order over an entire surface; and (C3) etching the second polysilicon film to form a gate electrode of the logic transistor. In the above-mentioned (B3) process, the single gate electrode is formed by etching the polysilicon film, the second gate insulating film and the second polysilicon film.

It is apparent that the present invention is not limited to the above embodiment and may be modified and changed without departing from the scope and spirit of the invention.

What is claimed is:

1. A semiconductor memory device, comprising:
   a substrate;
   a memory cell transistor of a split-gate type formed on said substrate, said memory cell transistor having a source/drain region, a floating gate and a control gate, and is configured to store data and generate a read current;
   a MIS (Metal Insulator Semiconductor) reference transistor formed on said substrate, said reference transistor having a source/drain region and a first single gate and is configured to generate a reference current;
   a sense amplifier connected to said source/drain region of said memory cell transistor and to said source/drain region of said reference transistor, said sense amplifier being configured to compare said read current generated by said memory cell transistor with said reference current generated by said reference transistor to read said data stored in said memory cell transistor;
   a conductive layer formed above said reference transistor;
   a MIS (Metal Insulator Semiconductor) logic transistor used in a logic circuit, said logic transistor having a second single gate whose material and thickness are the same as those of said conductive layer;
   a first insulating film formed between said first single gate and said substrate;
   a second insulating film formed between said conductive layer and said first single gate;
   a third insulating film formed between said second single gate and said substrate; and
   a contact configured to penetrate through said second insulating film, and connected to said first single gate,
   wherein said first single gate operates as a gate electrode of said reference transistor.

2. The semiconductor memory device according to claim 1, wherein a material of said control gate is the same as that of said first single gate.

3. A semiconductor memory device, comprising:
   a substrate;
   a memory cell transistor of a split-gate type formed on said substrate, wherein said memory cell transistor comprises a source/drain region, a floating gate, a control gate and a first gate insulating film located between said substrate and said control gate;
   a reference transistor formed on said substrate and used for generating a reference current that is used in sensing data stored in said memory cell transistor, wherein said reference transistor comprises a source/drain region, a first single gate and a second gate insulating film located between said substrate and said first single gate;
   a sense amplifier coupled to said memory cell transistor and said reference transistor, wherein said sense amplifier is connected to said source/drain regions of both of said memory cell transistor and said reference transistor, and compares a read current generated by said memory cell transistor with said reference current generated by said reference transistor to read said data stored in said memory cell transistor;
   a conductive layer formed above said reference transistor;
   a logic transistor used in a logic circuit, wherein said logic transistor comprises a second single gate and a third gate insulating film located between said substrate and said second single gate;
   a fourth insulating film formed between said first single gate and said conductive layer; and a contact configured to penetrate through said fourth insulating film, and connected to said first single gate;
said first single gate operates as a gate electrode of said reference transistor;
a material of said control gate is the same as that of said first single gate; and
a material and a thickness of said second single gate are the same as those of said conductive layer.

4. The semiconductor memory device according to claim 1, wherein:
an impurity concentration distribution in said source/drain region of said reference transistor is equal to that of said memory cell transistor;
said first insulating film is further formed between said substrate and said control gate; and
said memory cell transistor is formed on a first well in said substrate, said reference transistor is formed on a second well in said substrate, and an impurity concentration distribution in said second well is equal to that in said first well.

5. The semiconductor memory device according to claim 1, wherein:
said memory cell transistor has a stacked gate structure in which said floating gate and said control gate partially overlap with each other;
said memory cell transistor further has a contact connected to said source-drain region;
said floating gate is fonned between said contact and said control gate; and
said floating gate has a pointed tip section overlapping with said control gate and pointing from said floating gate toward said control gate.

6. The semiconductor memory device according to claim 3, wherein:
an impurity concentration distribution in said source/drain region of said reference transistor is equal to that of said memory cell transistor;
a material and a thickness of said second gate insulating film are the same as those of said first gate insulating film; and
said memory cell transistor is formed on a first well in said substrate, said reference transistor is formed on a second well in said substrate, and an impurity concentration distribution in said second well is equal to that in said first well.

7. The semiconductor memory device according to claim 3, wherein:
said memory cell transistor has a stacked gate structure in which said floating gate and said control gate partially overlap with each other;
said memory cell transistor further has a contact connected to said source-drain region;
said floating gate is formed between said contact and said control gate; and
said floating gate has a pointed tip section overlapping with said control gate and pointing from said floating gate toward said control gate.

8. The semiconductor memory device according to claim 1, further comprising: a fourth insulating film formed between said control gate and said substrate,
wherein a thickness of said first insulating film is the same as that of said fourth insulating film.

9. The semiconductor memory device according to claim 3, wherein a thickness of said first gate insulating film is the same as that of said second gate insulating film.

10. A semiconductor device comprising:
a substrate which includes a first, a second and a third regions;
a memory cell transistor formed in said first region;
a reference transistor formed in said second region;
a logic transistor formed in said third region and used in a logic circuit; and
a sense amplifier coupled to said memory cell transistor and said reference transistor, and configured to compare a read current generated by said memory cell transistor with a reference current generated by said reference transistor to read data stored in said memory cell transistor,
wherein said memory cell transistor comprises:
a first insulating layer formed above said substrate;
a charge storage layer formed above said first insulating layer;
a second insulating layer formed above charge storage layer;
a first conductive layer formed at a side of said charge storage layer and said second insulating layer as a side wall, and operating as a control gate electrode of said memory cell transistor;
a third insulating layer formed between said substrate and said first conductive layer; and
a first and a second diffusion layers formed on a surface of said substrate corresponding to a position such that said charge storage layer and said first conductive layer are between said first and second diffusion layers, and operating as a source and a drain of said memory cell transistor,
wherein said reference transistor comprises:
a fourth insulating layer formed above said substrate, having a same thickness as said third insulating layer, and composed of a same material as said third insulating layer;
a second conductive layer formed above said fourth insulating layer, composed of a same material as said first conductive layer, and operating as a gate electrode of said reference transistor;
a fifth insulating layer formed above said second conductive layer;
a third conductive layer formed above said fifth insulating layer;
a contact configured to penetrate through said fifth insulating layer, and coupled to said second conductive layer; and
a third and a fourth diffusion layers formed on a surface of said substrate corresponding to a position such that said second conductive layer is between said third and fourth diffusion layers, and operating as a source and a drain of said reference transistor, and
wherein said logic transistor comprises:
a sixth insulating layer formed above said substrate;
a fourth conductive layer formed above said sixth insulating layer, having a same thickness as said third conductive layer, composed of a same material as said third conductive layer, and operating as a gate electrode of said logic transistor; and
a fifth and a sixth diffusion layers formed on a surface of said substrate corresponding to a position such that said fourth conductive layer is between said fifth and sixth diffusion layers, and operating as a source and a drain of said logic transistor.

11. The semiconductor device according to claim 10, wherein said memory cell transistor has a stacked structure in which said charge storage layer and said first conductive layer partially overlap with each other, and
wherein said charge storage layer has a pointed tip section overlapping with said first conductive layer, and pointing from said charge storage layer toward said first conductive layer.

* * * * *